(12) United States Patent
Suzuki

(10) Patent No.: US 6,538,935 B1
(45) Date of Patent: Mar. 25, 2003

(54) SEMICONDUCTOR MEMORY DEVICE ENABLING RELIABLE STRESS TEST AFTER REPLACEMENT WITH SPARE MEMORY CELL

(75) Inventor: Takanobu Suzuki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/196,209

(22) Filed: Jul. 17, 2002

(30) Foreign Application Priority Data

Jan. 8, 2002 (JP) ........................................ 2002-001662

(51) Int. Cl.[7] .............................................. G11C 29/00
(52) U.S. Cl. .................... 365/200; 365/201; 365/230.06
(58) Field of Search .................................. 365/200, 201, 365/63, 230.06

(56) References Cited

U.S. PATENT DOCUMENTS

| | | | | |
|---|---|---|---|---|
| 4,860,260 A | * | 8/1989 | Saito et al. | 365/201 |
| 6,297,997 B1 | * | 10/2001 | Ohtani et al. | 365/201 |
| 6,469,943 B2 | * | 10/2002 | Ochi | 365/200 |

* cited by examiner

Primary Examiner—Son T. Dinh
(74) Attorney, Agent, or Firm—McDermott, Will & Emery

(57) ABSTRACT

An activation control circuit activates an address decoder if a test mode signal TM1 is at the H level and a write identification signal WZRG is at the H level even if a spare column-active signal SCE is activated. With this, a normal column select line CSL can simultaneously be selected with a spare column select line SCSL, and opposite data patterns can be written to adjacent memory cells. Therefore, a regular stress can be applied to the adjacent memory cells in a burn-in test, for example, even after a defective memory cell is replaced with a spare memory cell.

9 Claims, 12 Drawing Sheets

SEMICONDUCTOR MEMORY DEVICE ENABLING RELIABLE STRESS TEST AFTER REPLACEMENT WITH SPARE MEMORY CELL

BACKGROUND OF THE INVENTION

1. Field of the Invention

The present invention relates to a semiconductor memory device and, more particularly, to a semiconductor memory device having a spare memory cell.

2. Description of the Background Art

In general, a semiconductor memory device has a spare memory cell for replacing a defective memory cell. When a defect is found in a normal memory cell, it is replaced with a spare memory cell on the basis of a word line or a column select line.

Initially, a semiconductor memory device is tested in a wafer state. When a defective memory cell is found by this test, an address of the defective memory cell is stored in a spare determination circuit of an address decoder. This storing operation is sometimes called programming.

For example, the spare determination circuit includes a fuse element, and the address of the defective memory cell is programmed by selectively blowing the fuse element by a laser beam or the like.

In a repaired chip after replacement of the defective memory cell, the spare memory cell rather than the normal memory cell is selected when the address corresponding to the defective memory cell is input. Therefore, when the replacement takes place, only the spare memory cell will be accessible for the certain address.

FIG. 12 shows an arrangement of memory cells related to a select operation of a conventional memory cell.

Referring to FIG. 12, a defective memory cell is replaced on the basis of a word line or a column select line.

As an example, a bit defect existing in a memory cell corresponding to an intersection of a word line WL1 and a bit line BL4 is described. A bit defect means a defect occurring in one memory cell. Other defects include a word line defect which is a disconnection of a word line, a bit line defect which is a disconnection of a bit line, and the like. A chip with the word line defect can only be repaired by replacing the memory cell on the basis of a word line. Similarly, a chip with the bit line defect can only be repaired by replacing the memory cell on the basis of a column select line.

Meanwhile, the bit defect can be repaired by a row replacement, i.e., selecting a spare word line SWL0 in place of a word line WL1, or by a column replacement, i.e., selecting a spare column select line SCSL0 in place of a column select line CSL4.

FIG. 12 shows an example of a replacement of a memory cell by selecting the spare column select line SCSL0 in place of the column select line CSL4 in a chip having the bit defect.

With such replacement, the semiconductor memory device can operate normally even if a bit defect exists.

However, to ensure reliability of a semiconductor memory device, sometimes a stress is applied after the replacement of the memory cell for a reliability check operation test. Such test includes, for example, a burn-in test which removes an early defect by an acceleration test.

In FIG. 12, a pattern is written to a memory cell array so that the data held by adjacent memory cells will be opposite to each other. A minor leak defect between an object memory cell and the adjacent memory cell can be removed by writing such a pattern.

However, as the replacement is performed by selecting the spare column select line SCSL0 in place of the column select line CSL4, desired data will not be written to the memory cells (the memory cell column including the bit defect) which should be selected by the column select line CSL4 if it were not for the bit defect. Thus, a sufficient stress cannot be applied to a memory cell group selected by column select lines CSL3 and CSL5 which are adjacent to the memory cell column including the bit defect.

FIG. 13 shows a problem caused by a replacement of a memory cell on the basis of a word line.

Referring to FIG. 13, when a replacement is performed by selecting a spare word line SWL0 in place of a word line WL8, a problem similar to that described with reference to FIG. 12 occurs. That is, the test performed by applying a stress to a memory cell with a write data pattern is not fitted for the semiconductor memory device in which the replacement is performed.

In FIG. 13, a pattern is written to a memory cell array so that the data written to adjacent memory cells will be opposite to each other.

However, the word line WL8 will not be activated since the replacement is performed by selecting the spare word line SWL0 in place of the word line WL8. Thus, desired data will not be written to the memory cells (the memory cell row including the bit defect) which should be selected by the word line WL8 if it were not for the bit defect. Therefore, a sufficient stress cannot be applied to a memory cell group selected by word lines WL7 and WL9 which are adjacent to the memory cell row including the bit defect.

As shown in FIGS. 12 and 13, when the memory cell is replaced with the spare memory cell and when the test is performed by applying a stress to a memory cell with a write data pattern, the stress applied to the periphery of the replaced region will be insufficient.

In particular, after the defect such as one bit defect was repaired, most of the memory cells connected to the word line or the column select line used for selecting the defective memory cell are normally accessible. Therefore, the reliability will be enhanced by writing data and applying a stress to this region.

SUMMARY OF THE INVENTION

An object of the present invention is to provide a semiconductor memory device ensuring high reliability even when a spare memory cell is used.

The present invention is summarized as a semiconductor memory device having a test mode and a normal mode as operation modes, including a plurality of normal memory cells, a plurality of spare memory cells and an address decode circuit.

The plurality of spare memory cells are used to replace a part of the plurality of normal memory cells in the normal mode.

The address decode circuit decodes an address signal and specifies a part of the sum of the plurality of normal memory cells and the plurality of spare memory cells.

If a write address provided by the address signal matches with a replacement address on data writing in the normal mode, the address decode circuit selects, in place of a first portion of the plurality of normal memory cells which corresponds to the address signal, a second portion of the plurality of spare memory cells which corresponds to the first portion.

On the other hand, if the write address matches with the replacement address on data writing in the test mode, the address decode circuit selects both of the first portion and the second portion.

Therefore, the principal advantage of the present invention is the ability to provide a semiconductor memory device having enhanced reliability even when a normal memory cell is replaced with a spare memory cell. That is, if data can be written to the most part of the replaced portion such as in the case of one bit defect, data can also be written to the replaced normal memory cells in the test mode, so that the regular stress can be applied to the peripheral portion of the replaced normal memory cells in the stress test.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
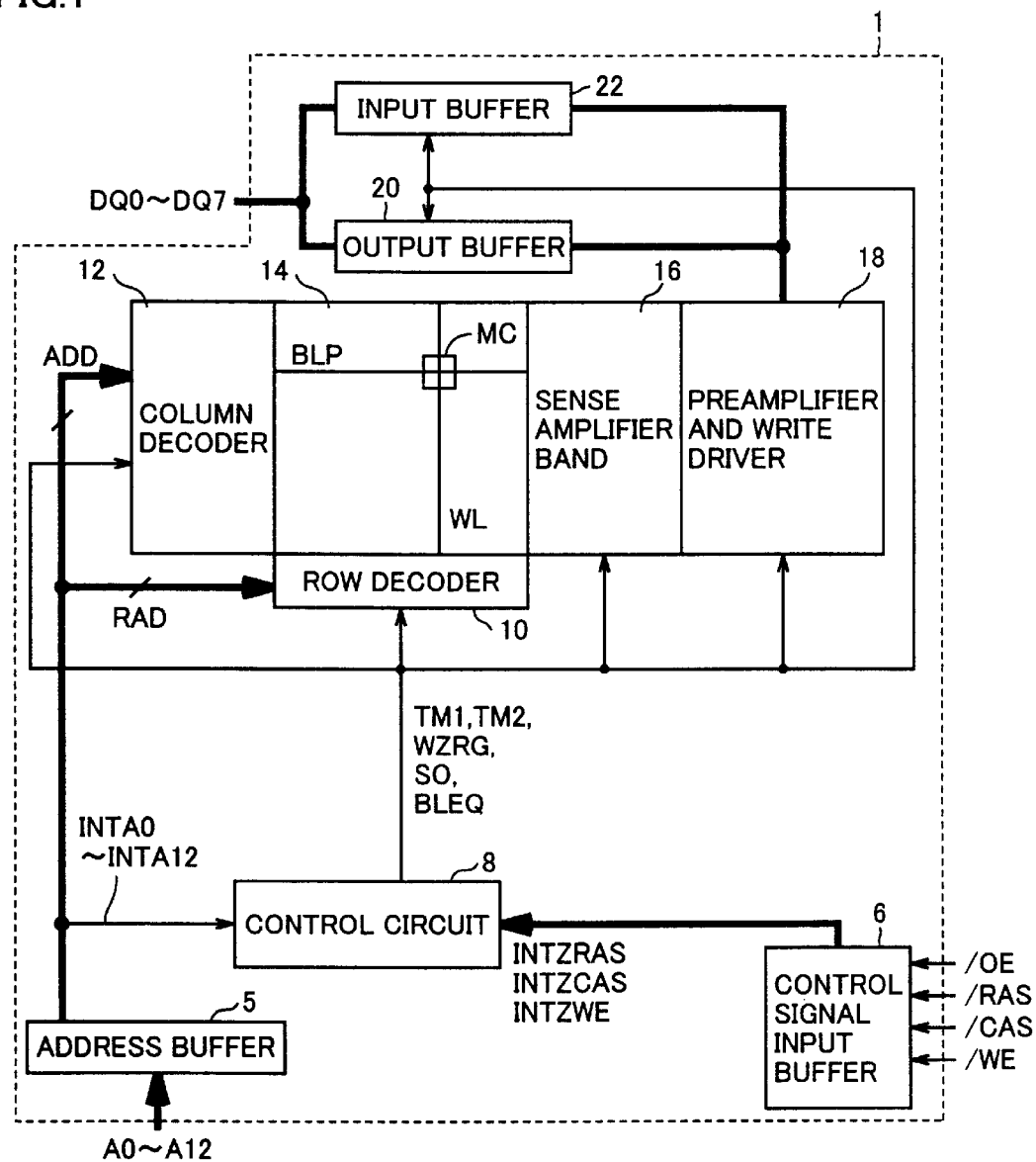
FIG. 1 is a block diagram showing a schematic configuration of a semiconductor memory device 1 of a first embodiment of the present invention.

In the following, the embodiments of the present invention are described in detail referring to the drawings. Here, the same characters in the drawings show the same or corresponding parts.

[First Embodiment]

Referring to FIG. 1, semiconductor memory device 1 includes a memory cell array 14 which has a plurality of memory cells arranged in rows and columns, an address buffer 5 which receives address signals A0–A12 and outputs an internal row address RAD and an internal column address ADD, and a control signal input buffer 6 which receives control signals /OE, /RAS, /CAS and /WE and outputs internal control signals INTZRAS, INTZCAS and INTZWE.

Memory cell array 14 includes memory cells MCs arranged in rows and columns, a plurality of word lines WLs provided corresponding to rows of the memory cells MCs, and bit line pairs BLPs provided corresponding to columns of the memory cells MCs. In FIG. 1, each one of the memory cells MCs, the word lines WLs and the bit line pairs BLPs are representatively shown.

Semiconductor memory device 1 further includes a control circuit 8 which receives the internal address signals INTA0–INTA12 from address buffer 5 and receives internal control signals INTZRAS, INTZCAS and INTZWE from control signal input buffer 6 to output control signals TM1–TM2, WZRG, SO and BLEQ to each block.

Control circuit 8 includes a circuit (not shown) which receives the internal control signals INTZRAS, INTZCAS and INTZWE and outputs a signal WZRG indicating a writing period, a signal SO for activating a sense amplifier, and an equalize signal BLEQ which activates an equalize circuit of a sense amplifier band.

Control circuit 8 further includes a circuit (not shown) which detects a setting indication for the test mode in response to the internal address signals INTA0–INTA12 and the internal control signals INTZRAS, INTZCAS and INTZWE, and outputs the test mode signals TM1 and TM2.

Semiconductor memory device 1 further includes a row decoder 10 which decodes the row address signal RAD provided from address buffer 5. Row decoder 10 drives the addressed row (word line) inside memory cell array 14 into a selected state.

The semiconductor memory device 1 further includes a column decoder 12 which decodes the internal column address ADD provided from address buffer 5 to generate a column select signal, and a sense amplifier band 16. A plurality of sense amplifiers, each detects and amplifies data of a memory cell MC connected to a selected row of memory cell array 14, are arranged in sense amplifier band 16.

Semiconductor memory device 1 further includes an input buffer 22 which receives a write data from the outside to generate an internal write data, a write driver which amplifies the internal write data from input buffer 22 and transmits it to a selected memory cell, a preamplifier which amplifies the data read from the selected memory cell, and an output buffer 20 which further amplifies the data from the preamplifier and outputs the resulting data to the outside.

In FIG. 1, the preamplifier and the write driver are shown as a block 18.

Figure 2:
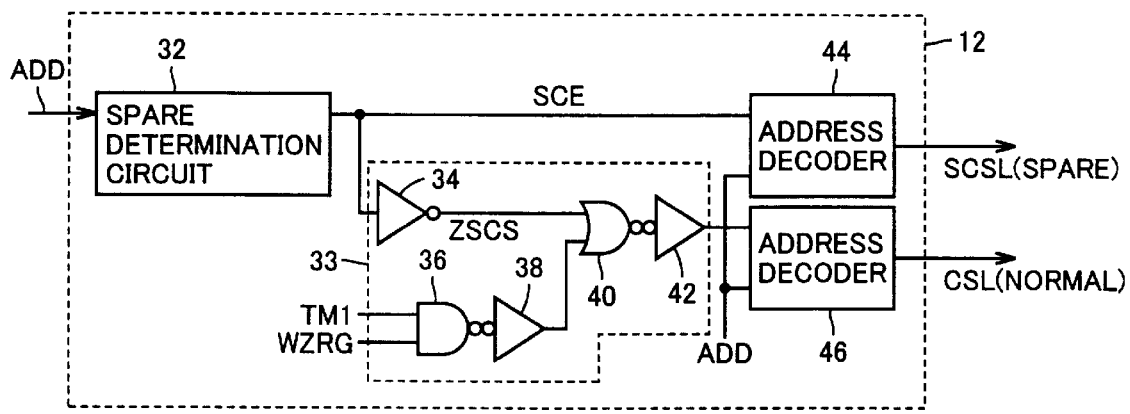
FIG. 2 is a circuit diagram showing a configuration of a column decoder 12 of the first embodiment.

Referring to FIG. 2, column decoder 12 is a circuit to simultaneously activate a normal column select line and a spare column select line.

Column decoder 12 includes a spare determination circuit 32 which determines whether or not to use a spare memory cell for an address signal ADD input from the outside and outputs a spare column-active signal SCE, an activation control circuit 33 which controls whether or not to activate a normal column select line in response to the spare column-active signal SCE, the test mode signal TM1 and the write identification signal WZRG, an address decoder 46 which is activated in response to an output of activation control circuit 33 to decode the address signal ADD and select a normal column select line CSL, and an address decoder 44 which is activated in response to the spare column-active signal SCE to decode the address signal ADD and select a spare column select line SCSL.

Activation control circuit 33 includes an inverter 34 which receives and inverts the spare column-active signal SCE and outputs a signal ZSCE, a NAND circuit 36 which receives the test mode signal TM1 and the write identification signal WZRG, an inverter 38 which receives and inverts an output of NAND circuit 36, an NOR circuit 40 which receives outputs of inverters 34 and 38, and an inverter 42 which receives and inverts an output of NOR circuit 40. An output of inverter 42 is provided to address decoder 46.

Spare determination circuit 32 determines whether or not to use a spare column select line for an address signal ADD input from the outside. When it determines to use the spare column select line, a spare column-active signal SCE is activated to the H level. On the other hand, when spare determination circuit 32 determines not to use the spare, it deactivates a spare column-active signal SCE to the L level.

Address decoder 46, which selects a normal column select line, decodes the address signal ADD and selects the corresponding column select line CSL when the spare column-active signal SCE is at the L level. Address decoder 44 for a spare column select line decodes the address signal ADD and selects the spare column select line SCSL when the spare column active signal SCE is at the H level.

Figure 3:
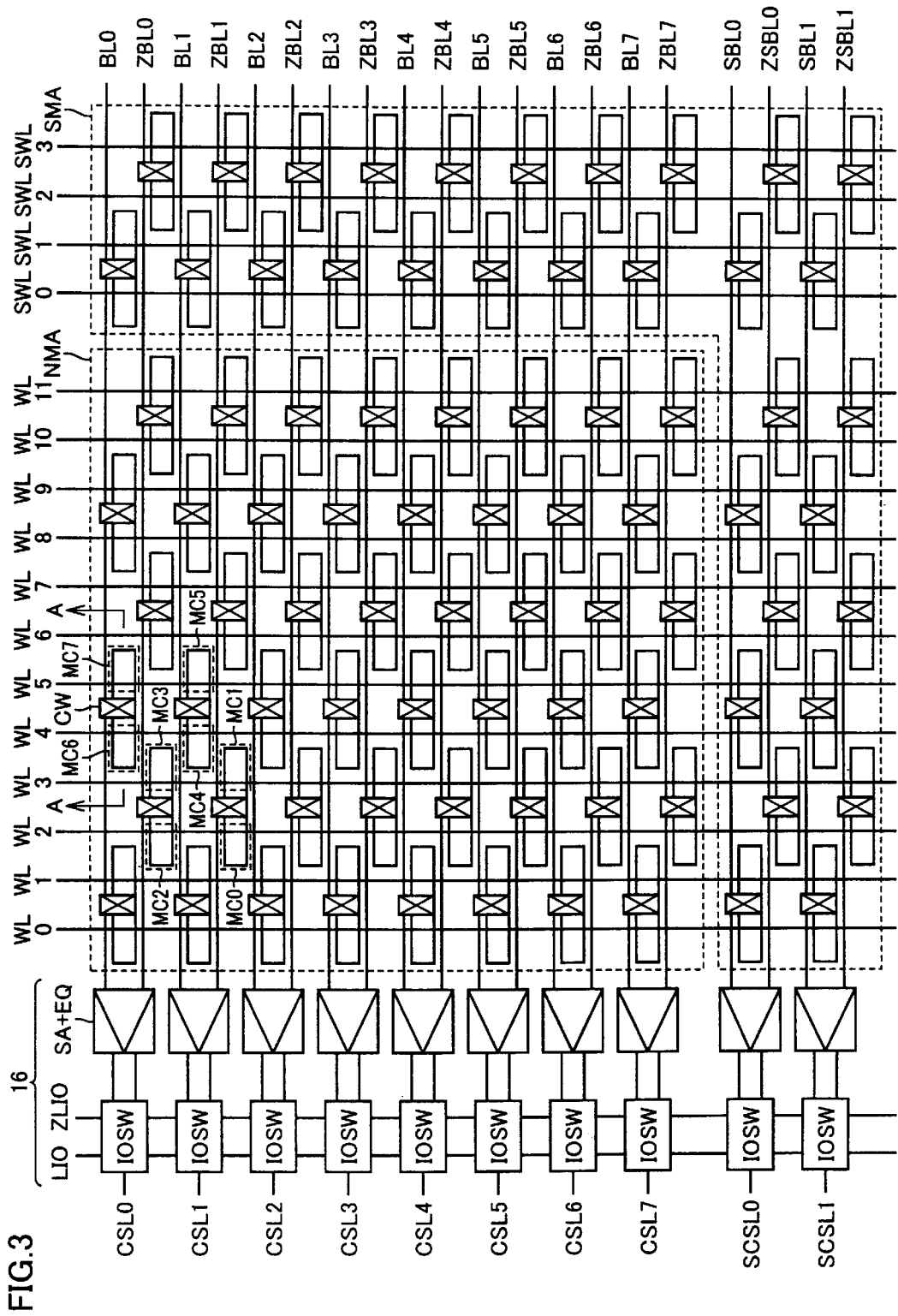
FIG. 3 shows a configuration of a part of a memory cell array 14 shown in FIG. 1.

FIG. 3 shows a configuration of a part of memory cell array 14 shown in FIG. 1. Though memory cell array 14 actually includes more rows and columns, it is shown in a smaller scale in FIG. 3 for simplifying the description.

FIG. 3 shows a normal memory cell area NMA, a spare memory cell area SMA, and a sense amplifier band 16.

In the normal memory cell area NMA, bit lines BL0–BL7 and ZBL0–ZBL7 corresponding to the columns of the normal memory cells intersect with word lines WL0–WL11 corresponding to the rows of the normal memory cells, and a plurality of normal memory cells are arranged.

The spare memory cell area SMA is arranged adjacent to the normal memory cell area NMA. The rows of the spare memory cells are arranged on the portion where the bit lines BL0–BL7 and ZBL0–ZBL7 intersect with the spare word lines SWL0–SWL3. The columns of the spare memory cells are arranged on the portion where the spare bit lines SBL0–SBL1 and ZSBL0–ZSBL1 intersect with the word lines WL0–WL11. It is to be noted that, the spare memory cells to be used in the simultaneous replacement of a row and a column are arranged on the portion where the spare bit lines SBL0–SBL1 and ZSBL0–ZSBL1 intersect with the spare word lines SWL0–SWL3.

The bit lines BL0 and ZBL0 form a bit line pair, and are connected to a sense amplifier SA and an equalize circuit EQ in sense amplifier band 16.

Similarly, the bit lines BL1–BL7 form bit line pairs with the bit lines ZBL1–ZBL7, respectively. In addition, the bit lines SBL0–SBL1 form bit line pairs with the bit lines ZSBL0–ZSBL1, respectively.

Such arrangement of memory cells is referred to as a "half-pitch cell" arrangement. Characteristics of the "half-pitch cell" arrangement will be described below.

A memory cell group corresponding to the points of intersection of the bit line BL0 with the word lines WL0, WL1, WL4, WL5, WL8, WL9, SWL0, and SWL1 is connected to the bit line BL0. Each memory cell in this memory cell group forms a pair with its adjacent memory cell to share a bit line contact CW for the connection to the bit line BL0.

A memory cell group corresponding to the points of intersection of the bit line ZBL0 with the word lines WL2, WL3, WL6, WL7, WL10, WL11, SWL2, and SWL3 is connected to the bit line ZBL0 adjacent to the bit line BL0. Each memory cell in this memory cell group forms a pair with its adjacent memory cell to share a bit line contact CW for the connection to the bit line ZBL0.

Such patterns are repeatedly arranged in the direction of rows along the word lines. In FIG. 3, an arrangement space between the bit line contacts CWs provided to one bit line indicates a basic arrangement pitch of a basic layout unit. In a second bit line adjacent to the first bit line, the arrangement of the bit line contacts CWs shifts from the arrangement of the bit line contacts CWs on the first bit line. Since the amount of the shift is half the basic arrangement pitch, such arrangement is referred to as a "half-pitch cell" arrangement.

Connections of the memory cells are further described below. The connection of the memory cells MC0–MC7 arranged in the normal memory area will be described as an example.

The memory cell MC0 is arranged corresponding to the point of intersection of the word line WL2 and the bit line ZBL1, and when the word line WL2 is activated, the capacitor in the memory cell MC0 is connected to the bit line ZBL1.

The memory cell MC1 is arranged corresponding to the point of intersection of the word line WL3 and the bit line ZBL1, and when the word line WL3 is activated, the capacitor in the memory cell MC1 is connected to the bit line ZBL1.

The memory cell MC2 is arranged corresponding to the point of intersection of the word line WL2 and the bit line ZBL0, and when the word line WL2 is activated, the capacitor in the memory cell MC2 is connected to the bit line ZBL0.

The memory cell MC3 is arranged corresponding to the point of intersection of the word line WL3 and the bit line ZBL0, and when the word line WL3 is activated, the capacitor in the memory cell MC3 is connected to the bit line ZBL0.

The memory cell MC4 is arranged corresponding to the point of intersection of the word line WL4 and the bit line BL1, and when the word line WL4 is activated, the capacitor in the memory cell MC4 is connected to the bit line BL1.

The memory cell MC5 is arranged corresponding to the point of intersection of the word line WL5 and the bit line BL1, and when the word line WL5 is activated, the capacitor in the memory cell MC5 is connected to the bit line BL1.

The memory cell MC6 is arranged corresponding to the point of intersection of the word line WL4 and the bit line BL0, and when the word line WL4 is activated, the capacitor in the memory cell MC6 is connected to the bit line BL0.

The memory cell MC7 is arranged corresponding to the point of intersection of the word line WL5 and the bit line BL0, and when the word line WL5 is activated, the capacitor in the memory cell MC7 is connected to the bit line BL0.

Figure 4:
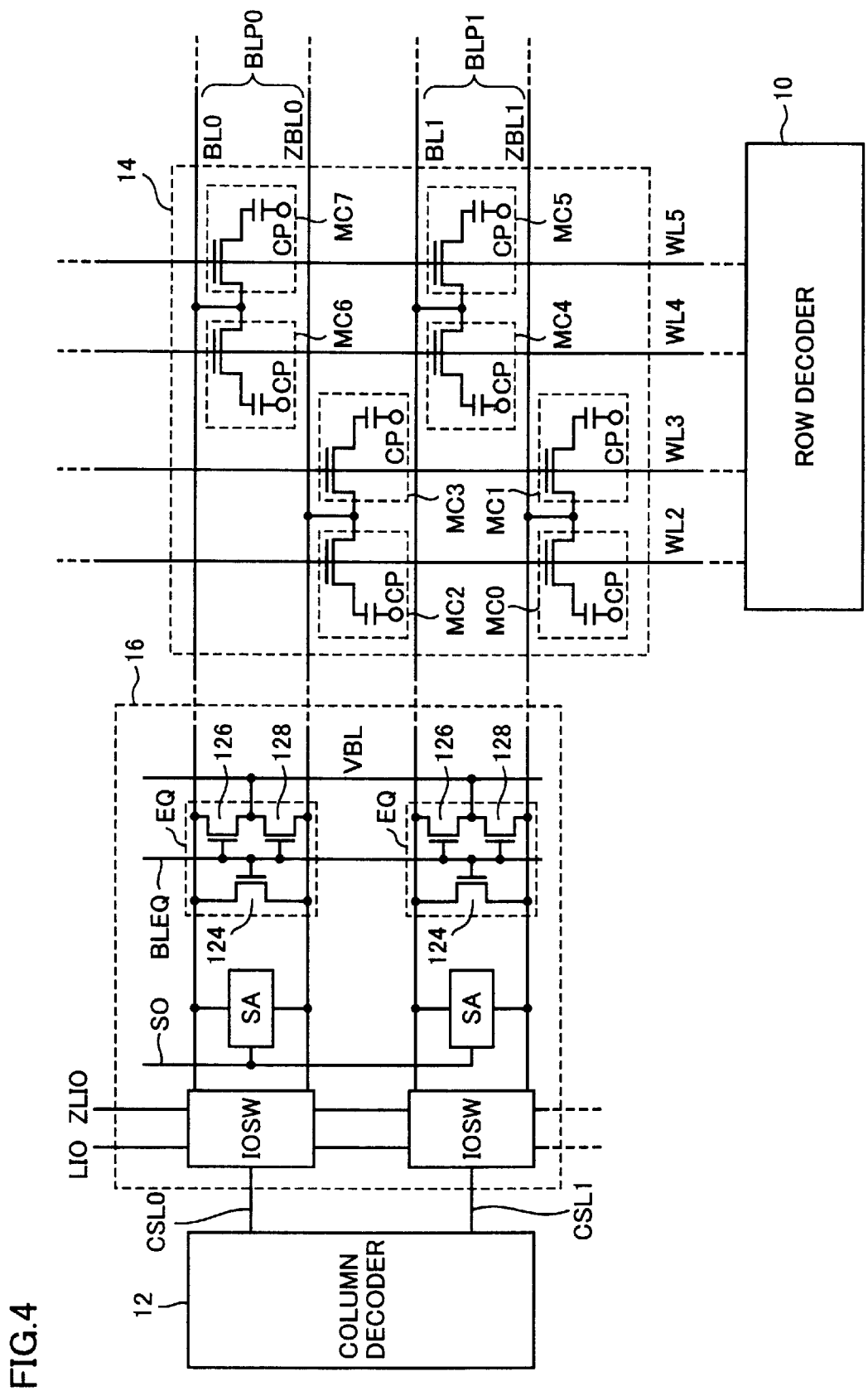
FIG. 4 is a circuit diagram showing a circuit corresponding to memory cells MC0–MC7 of FIG. 3.

Referring to FIG. 4, memory cell array 14 is connected to the word lines WL2–WL5 selected by row decoder 10 and the bit line pairs BLP0 and BLP1. The bit line pair BLP0 includes the bit lines BL0 and ZBL0. The bit line pair BLP1 includes the bit lines BL1 and ZBL1.

The memory cells MC0 and MC2 are selected by the word line WL2 and are connected to the bit lines ZBL1 and ZBL0, respectively. The memory cells MC1 and MC3 are selected by the word line WL3 and are connected to the bit lines ZBL1 and ZBL0, respectively. The memory cells MC4 and MC6 are selected by the word line WL4 and are connected to the bit lines BL1 and BL0, respectively. The memory cells MC5 and MC7 are selected by the word line WL5 and are connected to the bit lines BL1 and BL0, respectively.

Each memory cell includes a capacitor having one end connected to a cell plate CP, and a transfer gate connected between the other end of the capacitor and the corresponding bit line and activated to a conductive state in response to the corresponding word line. This transfer gate is an N-channel MOS transistor.

Sense amplifier band 16 includes a sense amplifier SA which is activated in response to a sense amplifier activation signal SO to amplify a potential difference generated in the bit line pair, an equalize circuit EQ which sets the potential of the bit line pair to a potential VBL in response to a bit line equalize signal BLEQ, and a switch IOSW which receives a select signal from column decoder 12 via the column select lines CSL0 and CSL1 and connects the bit line pair and a local input/output line pair LIO and ZLIO.

Each equalize circuit EQ includes an N-channel MOS transistor 124 which electrically connects two complementary bit lines, and N-channel MOS transistors 126 and 128 which respectively couple the two complementary bit lines to the potential VBL. Gates of the N-channel MOS transistors 124–128 receive a bit line equalize signal BLEQ.

Figure 5:
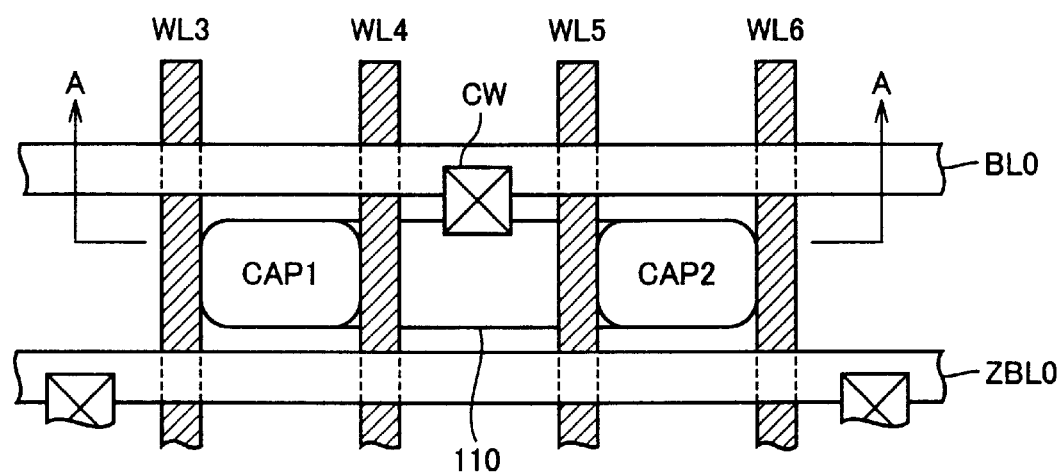
FIG. 5 is an enlarged view of a periphery of memory cells MC6 and MC7 of FIG. 3.

Referring to FIG. 5, the word lines WL3–WL6 intersect with the bit lines BL0 and ZBL0 at right angles. A capacitor CAP1 is formed in the region surrounded by the word lines WL3 and WL4 and the bit lines BL0 and ZBL0. A capacitor CAP2 is formed in the region surrounded by the word lines WL5 and WL6 and the bit lines BL0 and ZBL0.

An impurity region 110 is formed in the region surrounded by the word lines WL4 and WL5 and the bit lines BL0 and ZBL0. Impurity region 110 and the bit line BL0 are electrically connected by a contact window CW.

A transistor which becomes conductive in response to the activation of the word line WL4 is provided between impurity region 110 and the capacitor CAP1. A transistor which becomes conductive in response to the activation of the word line WL5 is provided between impurity region 110 and the capacitor CAP2.

Figure 6:
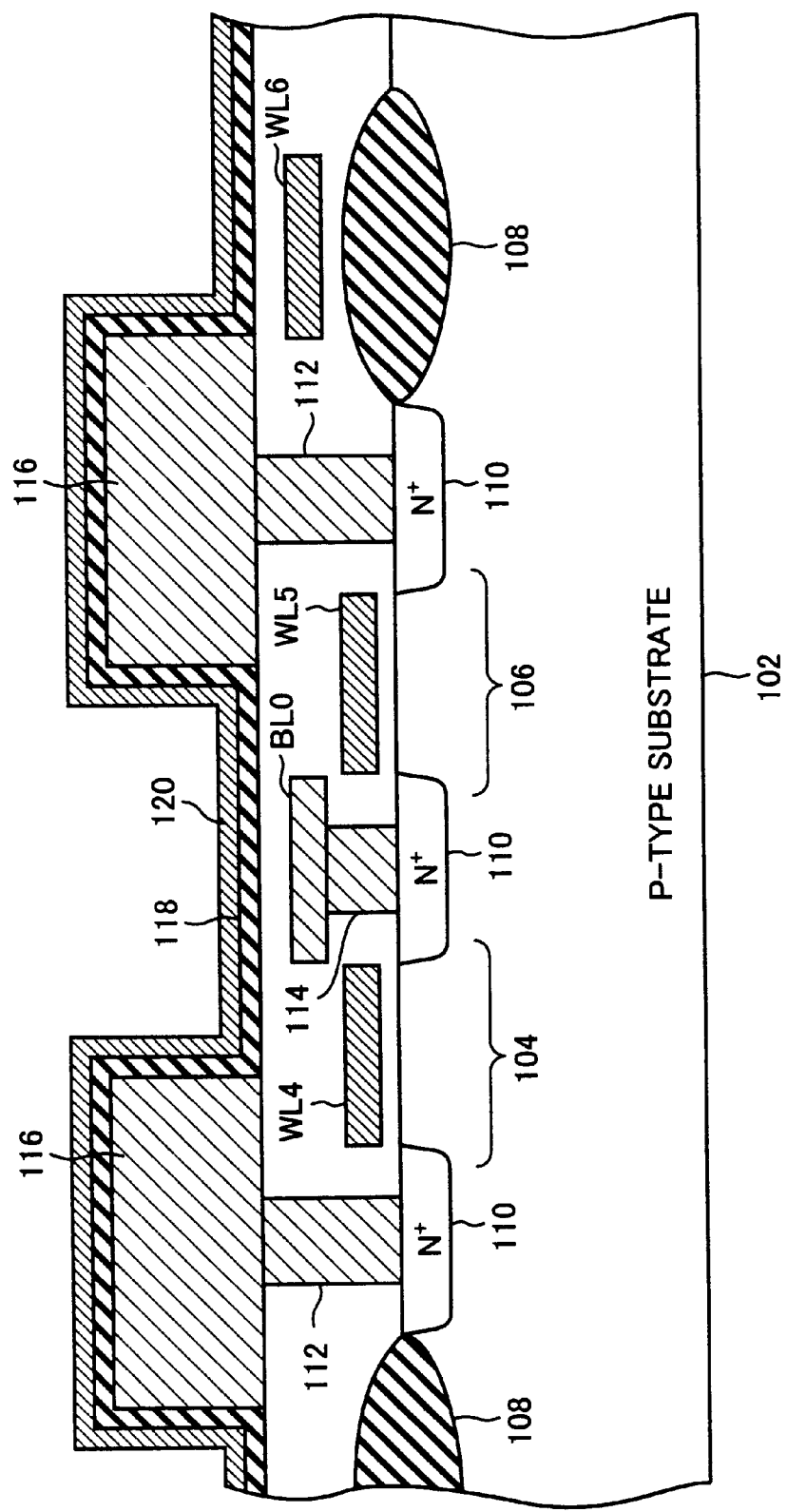
FIG. 6 is a cross sectional view with respect to the line A—A in FIG. 5.

Referring to FIG. 6, N-type impurity region 110 is formed on a surface portion of a P-type substrate 102, and each impurity region is isolated from another by an element isolation film 108. Each of the word lines WL4 and WL5 is formed on the region between two impurity regions 110, and transfer gates 104 and 106 are formed corresponding to the word lines WL4 and WL5. In FIG. 6, the transfer gate is an N-channel MOS transistor. In addition, in the cross section along the line A—A of FIG. 5, the word line WL6 is formed above element isolation film 108. Impurity region 110 between the word lines WL4 and WL5 is connected to the bit line BL0 by a bit line contact 114.

An electrode 116 corresponding to a storage node is formed. Electrode 116 is connected to impurity region 110 by a storage node contact 112. A capacitor insulating film 118 is formed on electrode 116, and a cell plate electrode film 120 is further formed on the capacity insulating film.

The contact window CW in FIG. 5 corresponds to bit line contact 114 in FIG. 6. In addition, each of the capacitors CAP1 and CAP2 in FIG. 5 corresponds to a capacitor formed with electrode 116, capacitor insulating film 118 and cell plate electrode film 120 in FIG. 6.

Figure 7:
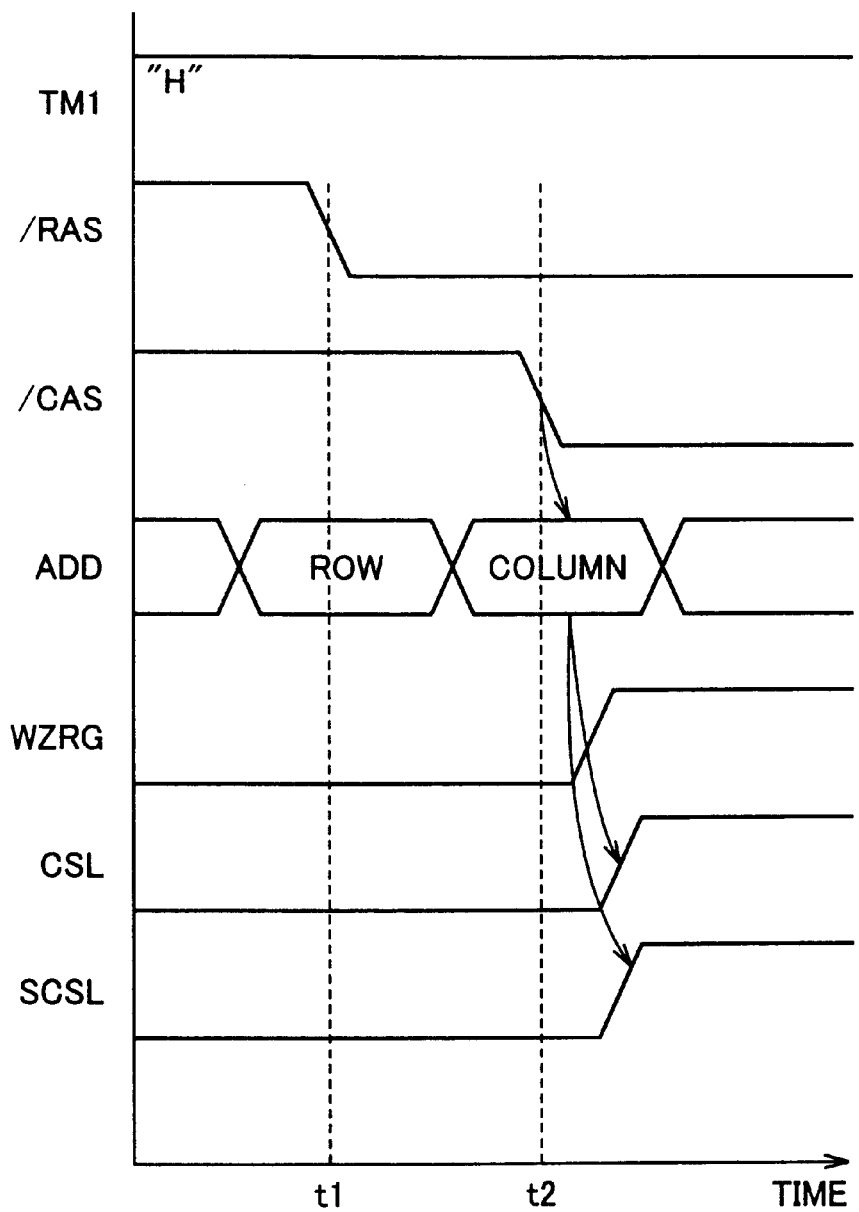
FIG. 7 is an operation waveform diagram showing a select operation of a column select line in a test mode.

An example in which the test mode signal TM1 is set to the H level is described with reference to FIGS. 2 and 7. The control signal /RAS falls and the row address is received at a time t1. When data is to be written, the write identification signal WZRG is activated to the H level immediately after a time t2 at which the column address is received. When the control signal /CAS falls to the L level at the time t2, the column address is received.

If the address matches with the address of the defective memory cell held in spare determination circuit 32, the spare column-active signal SCE attains to the H level. Since the test mode signal TM1 is at the H level and the write identification signal WZRG is at the H level, activation control circuit 33 activates address decoder 46. Thus, the spare column select line SCSL is selected in response to the activation of address decoder 44, and simultaneously, the column select line CSL is selected by address decoder 46.

Therefore, during the write operation, the normal column select line and the spare column select line are simultaneously activated when the address for using the spare memory cell is input. Then, the write data is written to both the spare memory cell and the normal memory cell.

It is to be noted that, during the read operation, only the spare column select line is activated as usual since the write identification signal WZRG is set to the L level. Therefore, the data held by the spare memory cell and the data held by the normal memory cell will not be read simultaneously into the same local input/output line.

Figure 8:
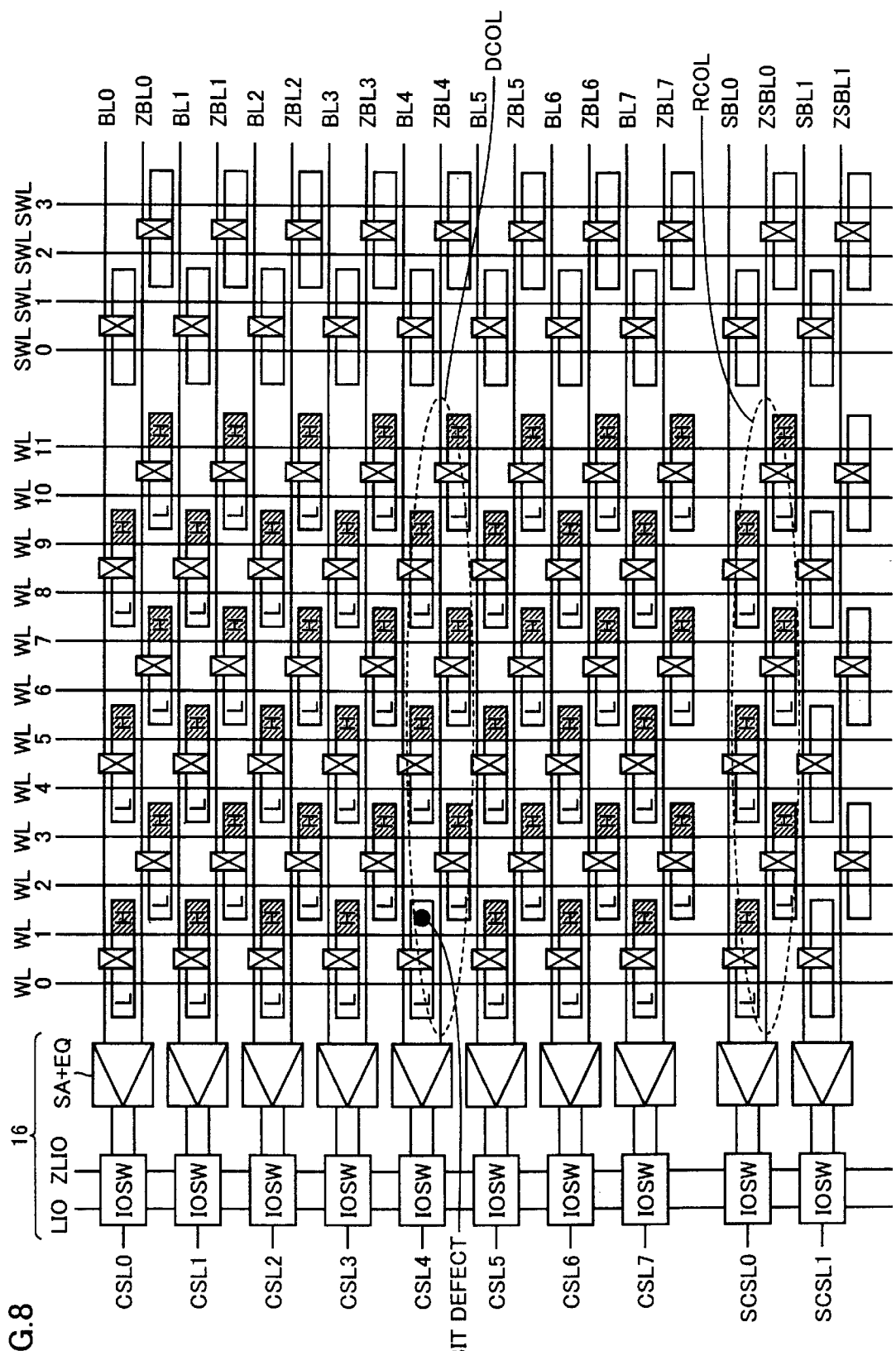
FIG. 8 shows the state when data is written to a memory cell by the semiconductor memory device of the first embodiment.

Referring to FIG. 8, a desired data pattern can also be written to the memory cell, other than the one with a bit defect, which is selected by the column select line CSL4 replaced with the spare column select line.

This means that, the data is also written to the defective memory cell column DCOL while the data is written to the replaced memory cell column RCOL when the spare column select line SCSL0 is selected. Thus, different data can be written to the two adjacent memory cells including the memory cell other than a bit defective memory cell which belongs to the defective memory cell column DCOL.

With this, a regular stress can be applied to the memory cell adjacent to the defective memory cell column DCOL, that is, to the memory cell selected by the column select lines CSL3 and CSL5.

Therefore, when the test is performed by applying a stress to a memory cell with a write data pattern for a chip after the repair, reliability higher than the prior art can be attained.

[Second Embodiment]

In a second embodiment, an example is described in which a replacement to a spare memory cell is performed on the basis of a word line.

Figure 9:
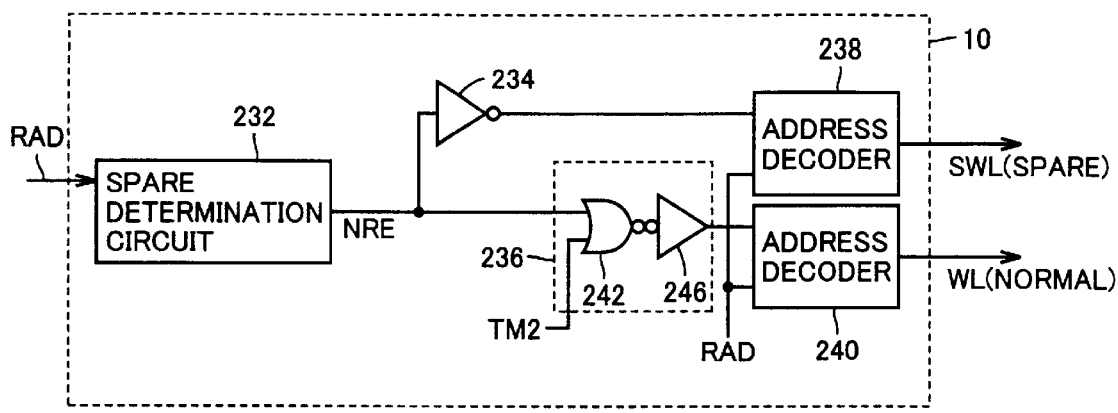
FIG. 9 is a circuit diagram showing a configuration of a row decoder 10 used in a second embodiment.

It is to be noted that, column decoder 12 shown in FIG. 2 of the first embodiment may be used together with the row decoder shown in FIG. 9, or column decoder 12 may be a conventional one and only row decoder 10 has the configuration shown in FIG. 9.

Referring to FIG. 9, row decoder 10 includes a spare determination circuit 232 which determines whether or not to use a spare memory cell in response to an address signal RAD, an inverter 234 which receives and inverts a normal-active signal NRE output from spare determination circuit 232, an activation control circuit 236 which receives the normal-active signal NRE and the test mode signal TM2 and determines whether or not to activate the normal word line, an address decoder 238 which is activated in response to the output of inverter 234 to select the spare word line SWL corresponding to the address signal RAD, and an address decoder 240 which is activated in response to the output of activation control circuit 236 to decode the address signal RAD and selects the word line WL.

Activation control circuit 236 includes an NOR circuit 242 which receives the normal-active signal NRE and the test mode signal TM2, and an inverter 246 which receives and inverts the output of NOR circuit 242. The output of inverter 246 is provided to address decoder 240.

The address corresponding to the defective memory cell is held in spare determination circuit 232. Spare determination circuit 232 determines whether or not to use the spare memory cell for the address signal RAD input from the outside, and outputs the normal-active signal NRE. If it determines to use the spare memory cell, the normal-active signal NRE is set to the L level. On the other hand, if it determines not to use the spare memory cell but to use the normal memory cell, the normalactive signal NRE is set to the H level.

In a normal mode in which the test mode signal TM2 is at the L level, address decoder 240 decodes the address signal RAD and selects the corresponding word line WL when the normal-active signal NRE is at the H level. When the normal-active signal NRE is at the L level, address decoder for spare 238 decodes the address signal RAD and selects the corresponding spare word line SWL.

Figure 10:
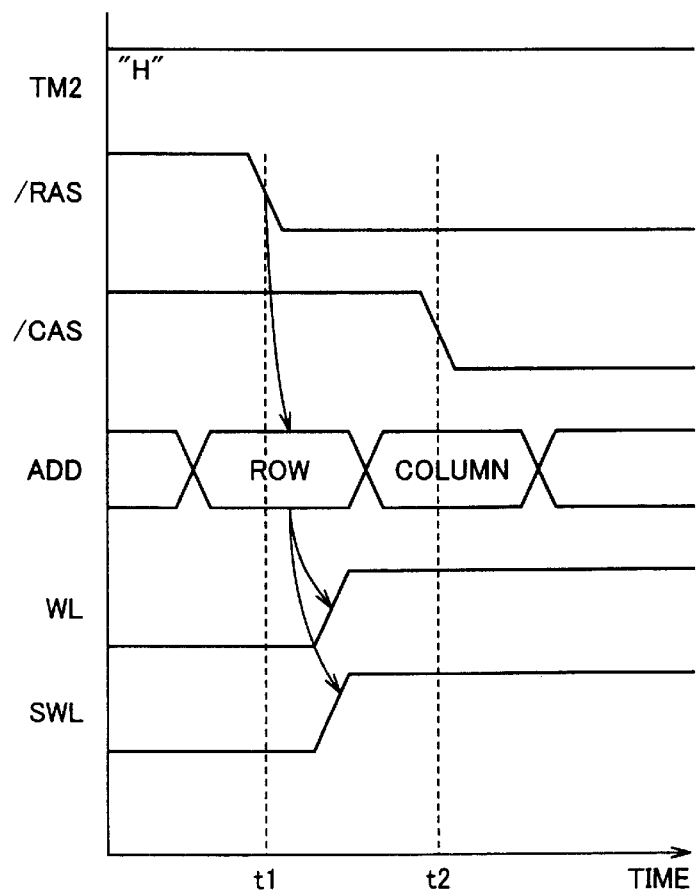
FIG. 10 is an operation waveform diagram showing an operation of row decoder 10 in a test mode.

Referring to FIGS. 9 and 10, row decoder 10 performs a test operation when the test mode signal TM2 is at the H level. The control signal /RAS falls at a time t1, and the row address is received. With NOR circuit 242, address decoder 240 decodes the address signal RAD and selects the corresponding word line WL even if the normal-active signal NRE is at the L level. Concurrently, address decoder 238 decodes the address signal RAD and selects the corresponding spare word line SWL.

With this, when the address for using the spare memory cell is input, the normal word line and the spare word line are simultaneously activated, and the write data is written to both the spare memory cell and the normal memory cell during the write operation.

On the other hand, during the read operation, the normal word line and the spare word line are simultaneously activated and the data are simultaneously read from the two memory cells. If the data held by the two memory cells are different, the data will be destroyed. Therefore, it is desirable to deactivate the test mode signal TM2 to exit the test mode before the read operation begins. For this purpose, the test mode signal TM2 is periodically controlled during the stress test.

It is to be noted that, when the data is written for the stress test, the normal word line and the spare word line are usually activated at the same time and the same data is written to the two memory cells. Thus, it is likely that the data will not be destroyed during the stress test operation except in the defective bit portion. Therefore, the periodical control of the test mode signal TM2 is not always necessary.

Figure 11:
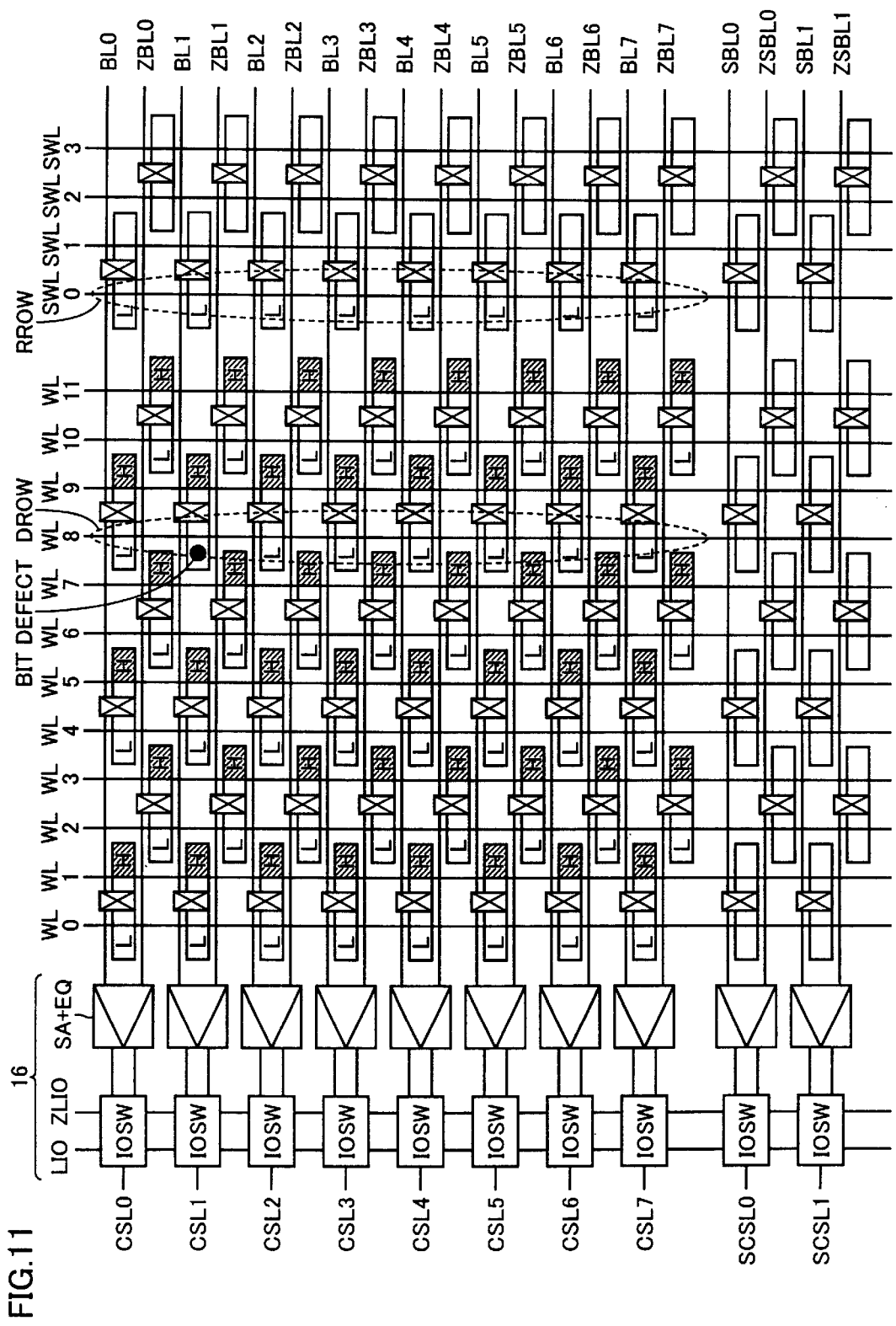
FIG. 11 shows the state when data is written in the second embodiment.
Figure 12:
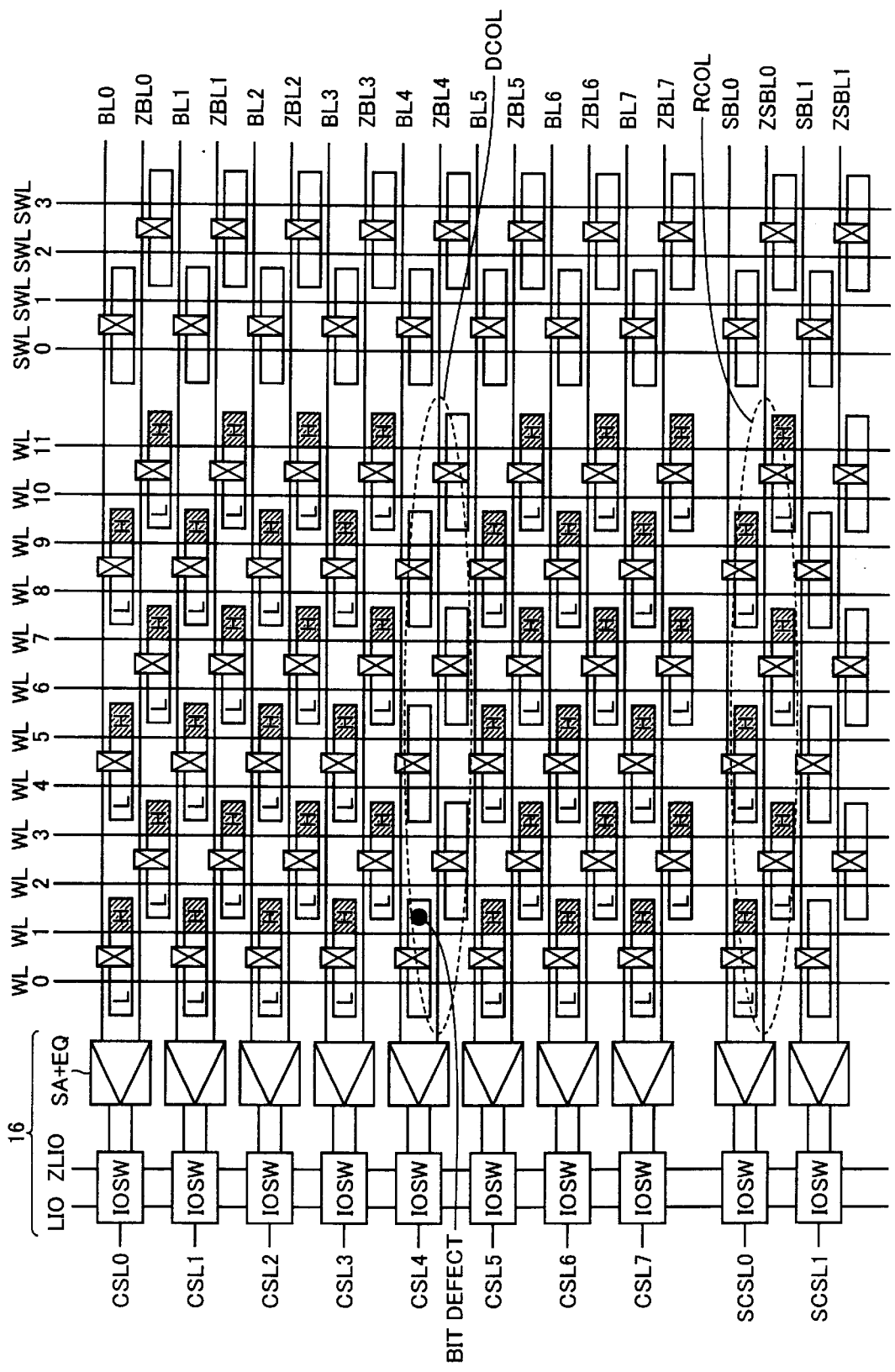
FIG. 12 shows an arrangement related to a select operation of a conventional memory cell.
Figure 13:
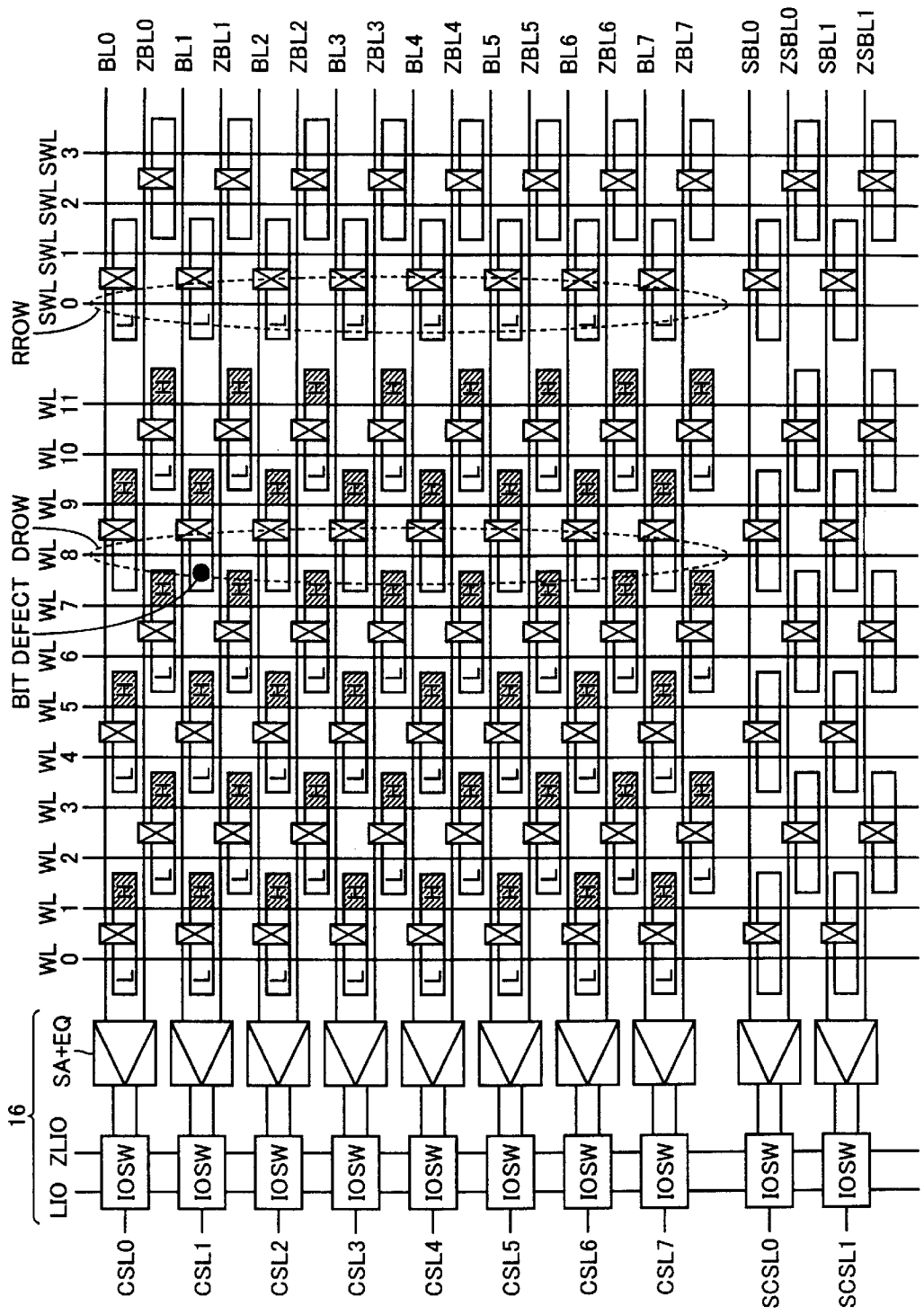
FIG. 13 shows a problem caused by a replacement of a memory cell on the basis of a word line.

Referring to FIG. 11, the word line WL8 is not activated during a normal operation because of the replacement operation. In the second embodiment of the present invention, the desired data pattern can be written to the memory cell, other than the one with a bit defect, which is selected by the word line WL8 in the test mode.

This means, during the write operation, the data corresponding to the data written in the replaced memory cell row RROW is simultaneously written to a memory cell group, excluding the bit defective memory cell, of the defective memory cell row DROW. Therefore, a sufficient stress can be applied to the memory cell group selected by the word lines WL7 and WL9 which exist in the regions adjacent to the defective memory cell row DROW.

Therefore, when a test is performed by applying a stress to a memory cell with a write data pattern for a chip after the repair, the test can be performed with an enhanced reliability. That is, the regular stress can be applied to the periphery of the memory cell group connected to the word line which selects the replaced bit defective memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test mode and a normal mode as operation modes, comprising:
   a plurality of normal memory cells;
   a plurality of spare memory cells used to replace a part of said plurality of normal memory cells in said normal mode; and
   an address decode circuit decoding an address signal and specifying a part of a sum of said plurality of normal memory cells and said plurality of spare memory cells; wherein
   if a write address provided by said address signal matches with a replacement address on data writing in said normal mode, said address decode circuit selects, in place of a first portion of said plurality of normal memory cells which corresponds to said address signal, a second portion of said plurality of spare memory cells which corresponds to said first portion, and if said write address matches with said replacement address on data writing in said test mode, said address decode circuit selects both of said first portion and said second portion.

2. The semiconductor memory device according to claim 1, wherein
   said plurality of normal memory cells are arranged separately on a plurality of normal memory cell columns;
   said first portion corresponds to one of said plurality of normal memory cell columns; and
   said address decode circuit includes
   a first select circuit selecting said first portion in response to said address signal,
   a replacement determination circuit holding said replacement address and detects a match of said write address and said replacement address to determine a replacement, and
   an activation control circuit activating said first select circuit in response to an output of said replacement determination circuit in said normal mode, and activating said first select circuit regardless of an output of said replacement determination circuit in said test mode.

3. The semiconductor memory device according to claim 2, wherein
   said address decode circuit further includes
   a second select circuit selecting said second portion of said plurality of spare memory cells in response to said address signal; and
   said activation control circuit activates one of said first select circuit and said second select circuit and deactivates the other in response to an output of said replacement determination circuit in said normal mode, and activates both of said first select circuit and said second select circuit together in response to an output of said replacement determination circuit in said test mode.

4. The semiconductor memory device according to claim 2, wherein
   at least a part of said plurality of spare memory cells are arranged on a spare column; and
   said spare column is adjacent to said plurality of normal memory cell columns and is parallel to said plurality of normal memory cell columns.

5. The semiconductor memory device according to claim 2, wherein
   said first select circuit activates one of a plurality of column select lines respectively corresponding to said plurality of memory cell columns in response to said address signal.

6. The semiconductor memory device according to claim 1, wherein said plurality of normal memory cells are arranged separately on a plurality of normal memory cell rows;

said first portion corresponds to one of said plurality of normal memory cell rows; and said address decode circuit includes a first select circuit selecting said first portion in response to said address signal, a replacement determination circuit holding said replacement address and detects a match of said write address and said replacement address to determine a replacement, and an activation control circuit activating said first select circuit in response to an output of said replacement determination circuit in said normal mode, and activating said first select circuit regardless of an output of said replacement determination circuit in said test mode.

7. The semiconductor memory device according to claim 6, wherein said address decode circuit further includes a second select circuit selecting said second portion of said plurality of spare memory cells in response to said address signal; and said activation control circuit activates one of said first select circuit and said second select circuit and deactivates the other in response to an output of said replacement determination circuit in said normal mode, and activates both of said first select circuit and said second select circuit together in response to an output of said replacement determination circuit in said test mode.

8. The semiconductor memory device according to claim 6, wherein at least a part of said plurality of spare memory cells are arranged on a spare row; and said spare row is adjacent to said plurality of normal memory cell rows and is parallel to said plurality of normal memory cell rows.

9. The semiconductor memory device according to claim 6, wherein said first select circuit activates one of a plurality of word lines respectively corresponding to said plurality of memory cell rows in response to said address signal.

* * * * *